United States Patent
Lee et al.

(10) Patent No.: US 7,414,317 B2
(45) Date of Patent: Aug. 19, 2008

(54) BGA PACKAGE WITH CONCAVE SHAPED BONDING PADS

(75) Inventors: Hyo Soo Lee, Daejeon (KR); Tae Gon Lee, Kyunggi-do (KR); Sung Eun Park, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 78 days.

(21) Appl. No.: 11/105,908

(22) Filed: Apr. 13, 2005

(65) Prior Publication Data

US 2006/0006536 A1    Jan. 12, 2006

(30) Foreign Application Priority Data

Jul. 6, 2004    (KR) ............. 10-2004-0052224
Feb. 28, 2005   (KR) ............. 10-2005-0016929

(51) Int. Cl.
  *H01L 23/48*   (2006.01)
  *H05K 7/10*    (2006.01)

(52) U.S. Cl. .............. 257/775; 257/781; 257/786; 257/E23.02; 361/767; 361/777; 361/808

(58) Field of Classification Search ............. None
See application file for complete search history.

(56) References Cited

U.S. PATENT DOCUMENTS

| 4,940,181 | A | * | 7/1990 | Juskey et al. ........... 228/180.21 |
| 5,121,299 | A | * | 6/1992 | Frankeny et al. ............ 361/785 |
| 5,196,726 | A | * | 3/1993 | Nishiguchi et al. .......... 257/737 |
| 5,726,500 | A | * | 3/1998 | Duboz et al. ................ 257/777 |
| 5,877,559 | A | * | 3/1999 | Takayama et al. ........... 257/773 |
| 6,622,907 | B2 | * | 9/2003 | Fanti et al. ................. 228/215 |
| 7,081,402 | B2 | * | 7/2006 | Hsu et al. ................... 438/612 |
| 2003/0178229 | A1 | * | 9/2003 | Toyoda et al. .............. 174/261 |

FOREIGN PATENT DOCUMENTS

| JP | 11-040940 | 2/1999 |
| TW | 457671   | 10/2001 |
| TW | 224387   | 11/2004 |

* cited by examiner

*Primary Examiner*—Alonzo Chambliss
(74) *Attorney, Agent, or Firm*—Darby & Darby

(57) ABSTRACT

In the BGA package and its manufacturing method, a bonding pad is etched from the exposed surface to a part of the insulation layer-coated region so as to form a solder contact side having a dish configuration, which is planar at a bottom center and slanted at a periphery. With this bent structure of the dish configuration, the bonding pad provides an increased bonding area for the solder, so that the BGA package substrate is enhanced in reliability.

22 Claims, 15 Drawing Sheets

| OSP thickness | Before thermal treatment | In-line process | EMC | PMC |
|---|---|---|---|---|
| 0.05um |  |  |  |  |
| 0.15um |  |  |  |  |

| Category | Rupture Mode | Results | |
|---|---|---|---|
| Ball shear Test |   | Min. | 80 |
| | | Max. | 441 |
| | | Avg. | 338.15 |
| | | Standard Deviation | 61.31 |
| | | Processing Ability | 0.48 |

BGA PACKAGE WITH CONCAVE SHAPED BONDING PADS

BACKGROUND OF THE INVENTION

1. Field of the Invention

The present invention relates to a BGA package and a method of manufacturing the same. Particularly, the present invention relates to a BGA package which has superior reliability, showing excellent interfacial properties and resistance to external impact. Also, the present invention is concerned with a method of manufacturing the BGA package, in which a bend having a planar upper surface and a slanted periphery is formed between a solder contact side of a bonding pad and an insulation layer, thereby providing an increased bonding area for a solder ball.

2. Description of the Related Art

Although integrated circuits have been developed for slimness and lightness, the number of leads extending from integrated circuit packages is increasing rather than decreasing. As a solution to the problem resulting from a small package carrier requiring a large number of leads, a PGA (pin grid array) carrier has been developed. Able as it is to be provided with many leads to its small area, the PGA carrier suffers from disadvantages that pins or leads are so weak that they break readily and that there are limits to high density integration.

An approach to overcoming the disadvantages of PGA is to use recently popularized BGA package substrates. BGA package substrates employ solder balls, which are finer than pins, thereby allowing high density integration thereon. Mostly, BGA package substrates are used for mounting semiconductor chips.

In order to better understand the background of the present invention, a description is given of a conventional BGA package substrate, below.

With reference to FIG. 1, a conventional semiconductor chip-mounted BGA package provided with solder balls 60 instead of pins is depicted in a cross sectional view.

First, a plurality of CCLs (copper clad laminates) 10 is prepared, each CCL 10 undergoing a typical photolithographic process to form a predetermined circuit pattern thereon.

Next, the CCLs 10, each having a predetermined circuit pattern thereon, are pressed against each other to provide a laminate structure which is then processed to form a via hole 20, followed by plating the via hole 20 with a copper foil 30 to electrically interconnect the circuit patterns formed on each CCL 10.

On the copper foil 30 formed on a side of the laminated CCL structure, a circuit pattern for a semiconductor chip 40-mounting bonding pad, e.g. a bond finger 50, is constructed by a photolithographic process. Likewise, a circuit pattern for bonding pads to which solder balls 60 are attached, that is, a circuit pattern for solder pads 70, is also constructed on a copper foil 30 formed on another side of the CCL structure.

Following the formation of the circuit patterns for the bonding pads 50 and 70 on the copper foils 30 of the CCL 10, PSR (photo imageable solder resist mask) ink is applied to form an insulation layer 80 with the aim of protecting the circuit patterns on the copper foils 30 as well as preventing the formation of a solder bridge between the circuit patterns during a soldering process.

Subsequently, with the aid of a diazo film having thereon a circuit pattern for exposing the bonding pad, a circuit process is conducted to remove the insulation layer 80 coated on the area where the bond finger 50 or the solder pad 70 will be formed.

After the formation of the bonding pad, such as the bond finger 50 or the solder pad 70, a finishing process for preventing the oxidation of the bonding pad is conducted to form a Ni/Au-plated layer on the bonding pad by electroless gold plating.

In more detail, the bonding pad, e.g., the bonding finger 50 or the solder pad 70, is plated with nickel to form a nickel-plated layer 91 to a predetermined height, e.g., 3-5 μm.

Gold, when applied to a bare bonding pad 50 or 70, diffuses into the copper texture of the bonding pad, so that the gold-plated layer cannot be subjected to the finishing process. Accordingly, nickel plating precedes gold plating in order to prevent gold, when plated, from diffusing into the copper texture.

Next, a gold-plated layer 92 is formed to a predetermined height, for example, 0.03-0.07 μm on the nickel-plated layer 91 so as to impart affinity for the solder balls 60. Therefore, a BGA package is obtained, with the bond finger for mounting a semiconductor device and the solder pad for attaching solder being finished.

In this conventional BGA package, the formation of the Ni/Au-plated layer 90 not only prevents the bonding pad, made from electrically conducting metal such as copper (Cu), that is, the solder pad 70, from being oxidized, but also provides the bonding pad with greater affinity for the solder balls 60; however, intermetallic compounds are produced due to the reaction between the nickel of the plated layer 90 and the tin of the solder balls 60.

A high-speed impact test such as a drop test revealed that cracking readily occurs at the interface between the Ni/Au-plated layer 90 and the solder balls due to the brittleness of Au in the presence of the intermetallic compounds including Au formed by the reaction of the Ni/Au layer with the solder, and thus that the solder balls 60 are readily detected from the solder pads.

As a solution to the problem, a BGA packaging process is suggested which employs an OSP (organic solderability preservative), instead of the Ni/Au-plated layer 90, in finishing the semiconductor chip-mounting bonding pad or the solder-bonding solder pad.

In lieu of the formation of the Ni/Au-plated layer 90 on the solder pad to which solder is attached, an OSP is layered on the solder pad to conduct the finishing process for the open solder pad.

Thereafter, the OSP-coated BGA package substrate is subjected to an in-line process consisting of prebake, die attach, die attach curing, plasma and wire bonding, through which a semiconductor device is connected onto the bonding pad formed on a side of the BGA package substrate.

The in-line process through which a semiconductor device is attached onto the bonding pad is followed by a back-end process consisting of prebake, plasma, pre-mold curing, post-mold curing, solder attach and IR reflower, through which a solder is attached to the solder pad formed on another side of the BGA package substrate.

However, the BGA package process using an OSP is disadvantageous in that the OSP applied to the plated layer where the solder pad is formed is damaged by heat during the in-line process or the back-end process as shown in FIG. 3. Especially, the PMC step of the back-end process, which is conducted at 175° C. or higher, causes fetal damage to the OSP.

With reference to FIG. 4, a ball shear test shows that the OSP thermally damaged during the in-line process or the back-end process remains in the plated layer at which the bonding finger or solder pad of the BGA package substrate is formed.

As shown in FIG. 5, when a solder is jointed to a planar, plated layer 170 which is not etched in a direction to a predetermined depth and in which a thermally damaged OSP 200 remains, the remaining OSP 200 decreases the bonding area between the plated layer 170 and the solder balls 60 and prevents the reaction between the copper of the plated layer 170 and the tin of the solder balls 60 to inhibit the formation of intermetallic compounds 700.

As a result, the BGA package becomes unreliable, showing the formation of a non-wetting zone on a solder side and poor interfacial properties. For example, as shown in FIG. 6, the solder balls 60 are not bonded to the plated layer 170 or readily detaches upon external impact.

SUMMARY OF THE INVENTION

Accordingly, the present invention has been made keeping in mind the above problems occurring in the prior art, and an object of the present invention is to provide a BGA package which has an increased bonding area between a bonding pad and a solder ball and thus exhibits excellent interfacial properties and resistance to external impact by dispersing the stress between the solder ball and the BGA package substrate.

It is another object of the present invention to provide a method of manufacturing the BGA package.

In an aspect of the present invention, an BGA package substrate, comprising: an outer circuit pattern including a bonding pad on which a solder contact side is formed; and an insulation layer, formed on the outer circuit pattern, having therein at least one opening through which the solder contact side is partially exposed, with a bend formed at a location spaced away from an end of a lower surface of the opening to a predetermined length in an outward direction, where a lower surface of the insulation layer meets the solder contact side, is provided.

In another aspect of the present invention, a BGA package substrate, comprising: an outer circuit pattern including a bonding pad on which a solder contact side appearing to be circular in a plan view is formed; and an insulation layer, formed on the outer circuit pattern, having therein at least one circular opening which is within the range of the solder contact side, with a bend formed at a location spaced away from an end of a lower surface of the opening to a predetermined length in an outward direction, where a lower surface of the insulation layer meets the solder contact side, is provided.

In a further aspect of the present invention, a BGA package substrate, comprising: an outer circuit pattern including a bonding pad on which a solder contact side is formed; an insulation layer, formed on the outer circuit pattern, having therein at least one opening through which the solder contact side is partially exposed; a solder ball formed in a bend and in and over the opening while being in contact with the solder contact side, with a bend formed at a location spaced away from an end of a lower surface of the opening to a predetermined length in an outward direction, where a lower surface of the insulation layer meets the solder contact side; and a semiconductor chip mounted on one side of the insulation layer, is provided.

In still a further aspect of the present invention, a method of manufacturing a BGA package substrate, comprising the steps of: (A) providing a base substrate having therein an outer circuit pattern including at least one bonding pad; (B) forming an insulation layer provided with an opening corresponding to the bonding pad over the base substrate, said opening exposing at least a part of the bonding pad therethrough; (C) etching the bonding pad from the exposed surface to a part of the insulation layer-coated region so as to form a solder contact side which is larger in cross sectional area than the opening; (D) mounting a semiconductor chip on the base substrate and molding the semiconductor chip; and (E) forming a solder ball in the bend and in and over the opening, allowing contact with the solder contact side.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
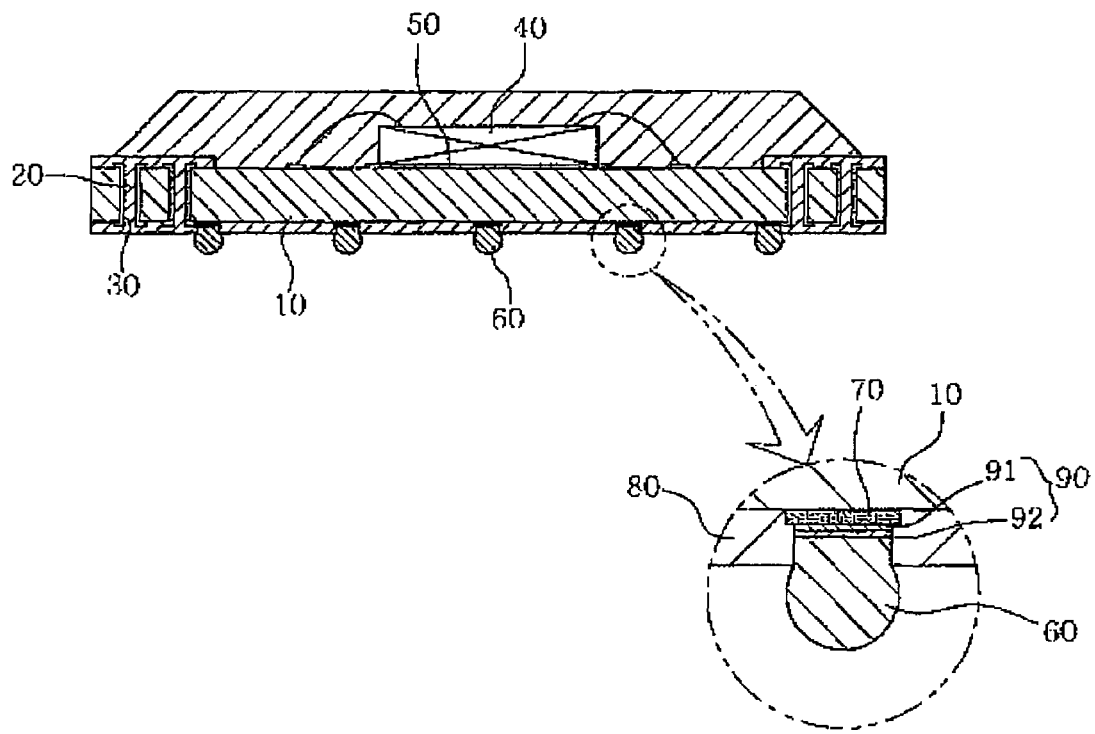
FIG. 1 show a structure of a conventional BGA package substrate in a cross sectional view and a partially enlarged view.
Figure 2:
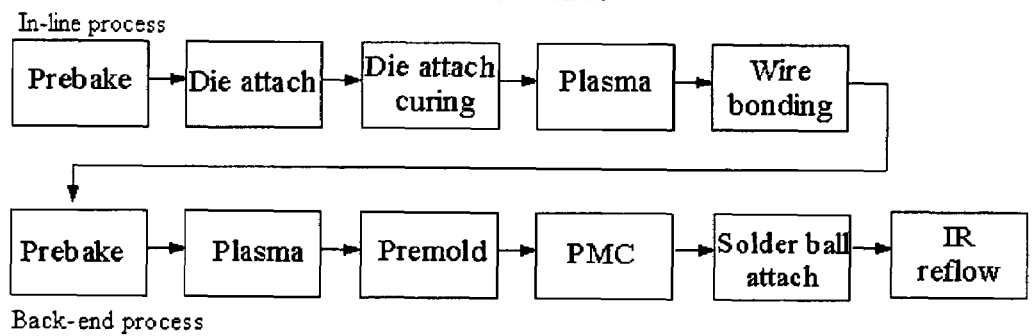
FIG. 2 is a block diagram showing the manufacturing processes of a BGA package substrate using a conventional OSP.
Figure 3:
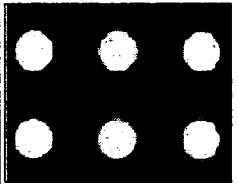
FIG. 3 is a view sequentially showing thermal damage to a bonding pad caused by thermal curing treatments conducted during a conventional BGA package process.
Figure 3:
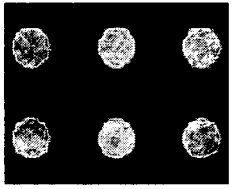
Figure 3:
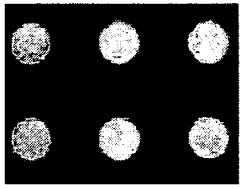
Figure 3:
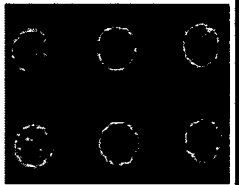
Figure 3:
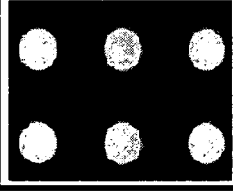
Figure 3:
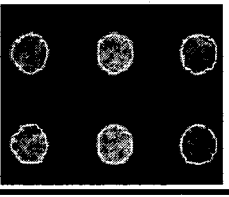
Figure 3:
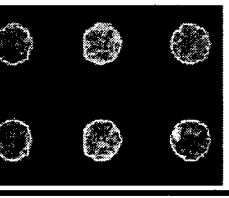
Figure 3:
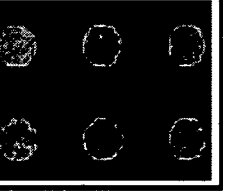
Figure 4:
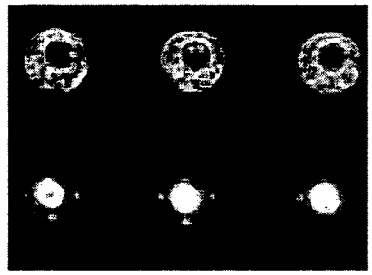
FIG. 4 is a view showing the destruction of the interface between solder and a bonding pad by the OSP which is thermally damaged due to thermal curing treatments during a conventional BGA package process.
Figure 4:
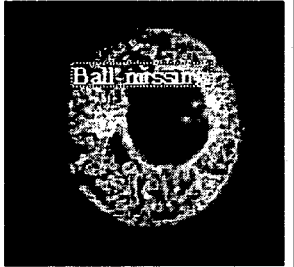
Figure 5:
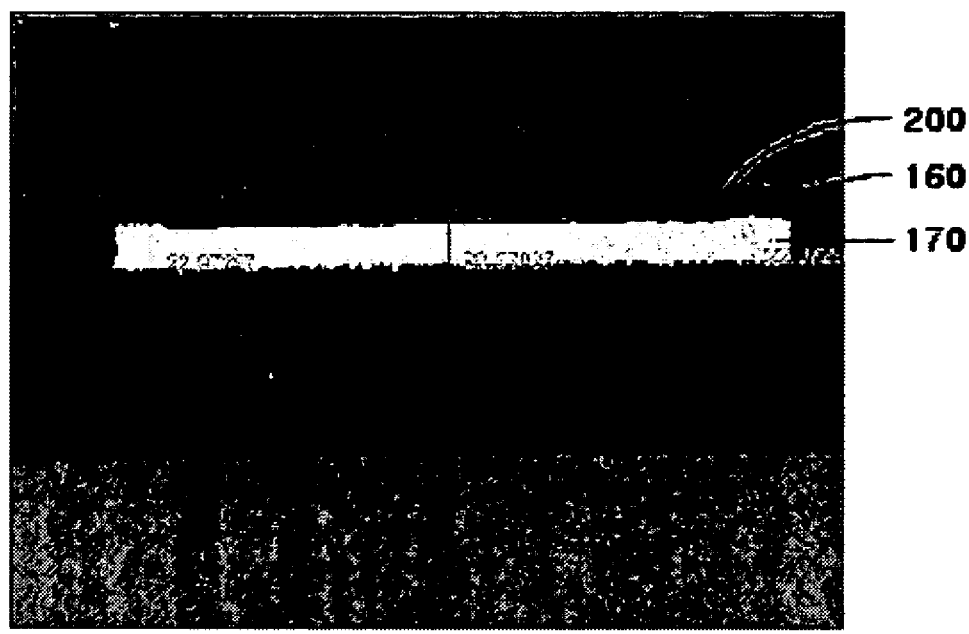
FIG. 5 is a view showing a planar bonding pad, fabricated by a conventional BGA package process.
Figure 6:
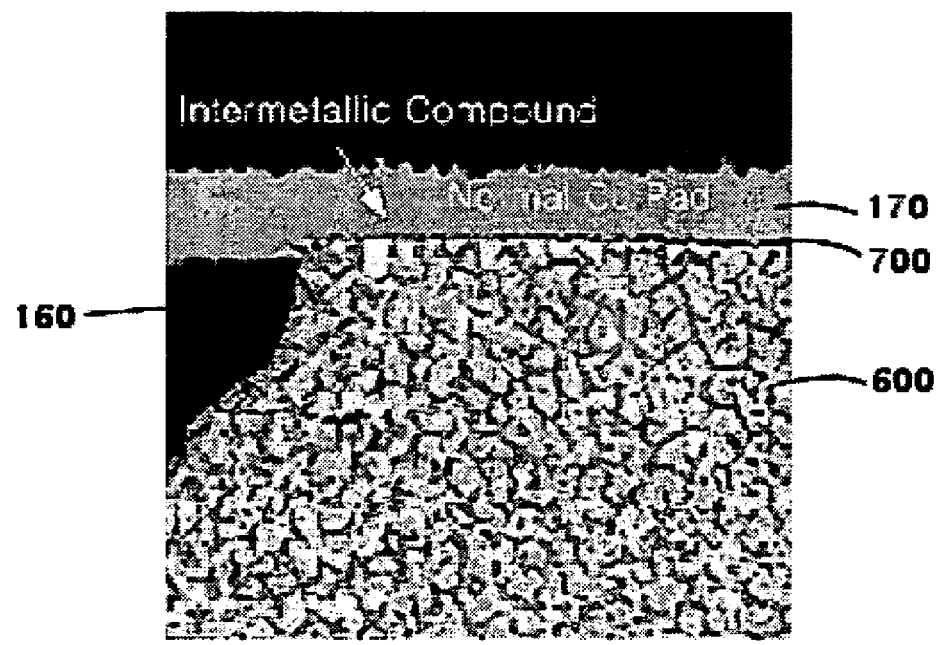
FIG. 6 is an enlarged view showing a solder ball attached to a planar bonding pad, fabricated by a conventional BGA package process.

Reference now should be made to the drawings, in which the same reference numerals are used throughout the different drawings to designate the same or similar components.

Figure 7:
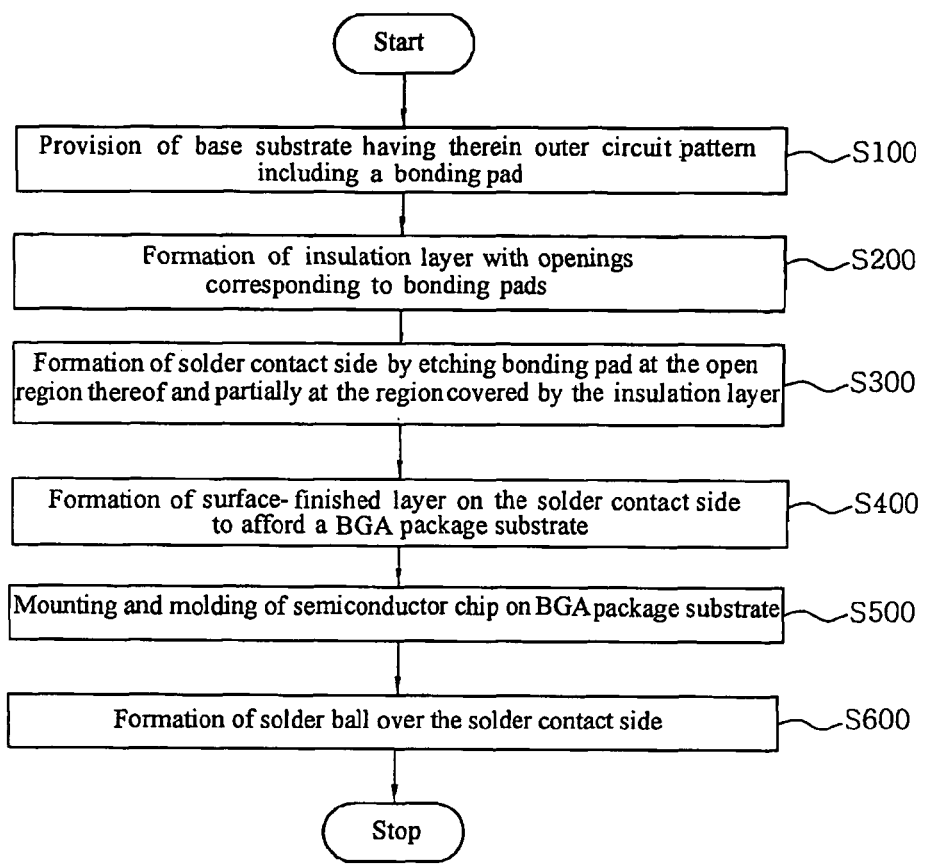
FIG. 7 is a flow chart showing the manufacturing process of a BGA package according to the present invention.

A method of manufacturing a BGA package in accordance with the present invention will be described with reference to FIGS. 7 and 8. FIG. 7 is a flow chart showing a manufacturing process for a BGA package and FIG. 8 provides cross sectional views showing the manufacture of a BGA package by process steps.

First, a base substrate is provided on which an outer circuit pattern, including a bonding pad, is formed (S100).

Figure 8A:
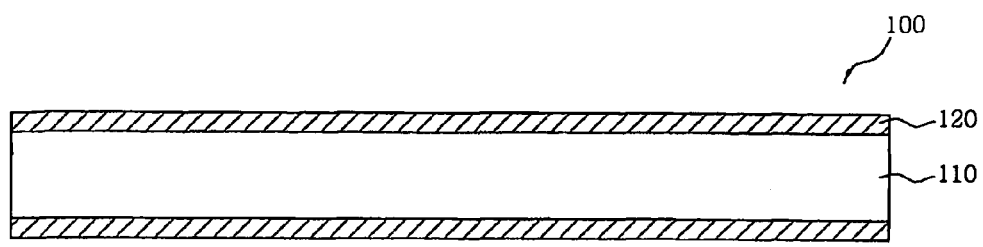
FIGS. 8A to 8P provide schematic cross sectional views showing the manufacturing process of a BGA package according to the present invention.
Figure 8B:
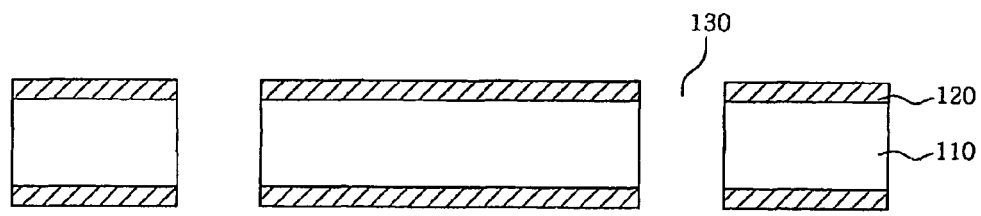

In more detail, a CCL (copper clad laminate), which is used as a base 100 of a BGA package substrate, is processed at a predetermined position to form a via hole 130 with interconnections to circuitry on the substrate, as shown in FIGS. 8A and 8B.

The CCL is made from a reinforcement 110 and copper foil 120. The reinforcement 110 is epoxy resin-impregnated glass fiber. The CCL is based on BT (bismaleimide)[21-22] or high Tg FR4[23] sandwiched between copper foils.

Figure 8C:
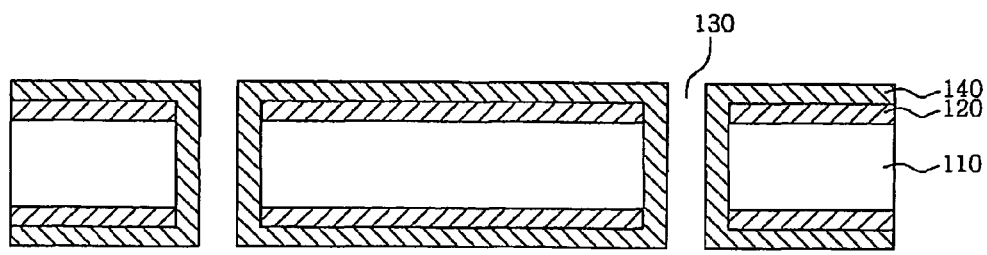

Next, the entire CCL, including the copper foil layer 120 and the via hole 130, is plated with copper to form a plated layer 140 through which interlayer electrical connection is achieved and on which a circuit pattern is formed, as shown in FIG. 8C.

Because the inner wall of the via hole 130, consisting partially of the insulator 110, makes it impossible to apply electro-copper plating thereto, the plated layer 140 is preferably formed to a small thickness by conducting electroless plating as a pretreatment for forming a conducting film necessary for the electro-copper plating.

Figure 8D:
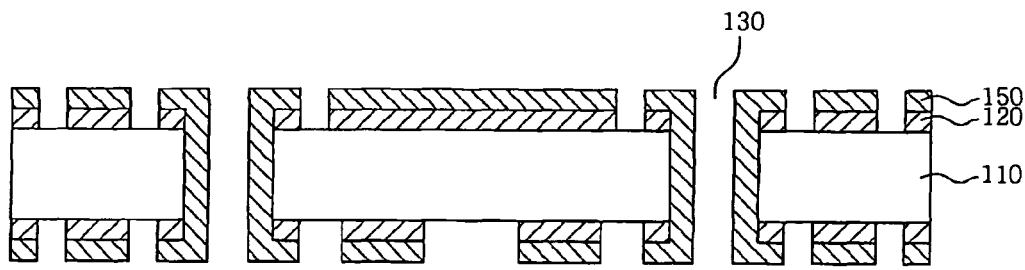
Figure 8E:
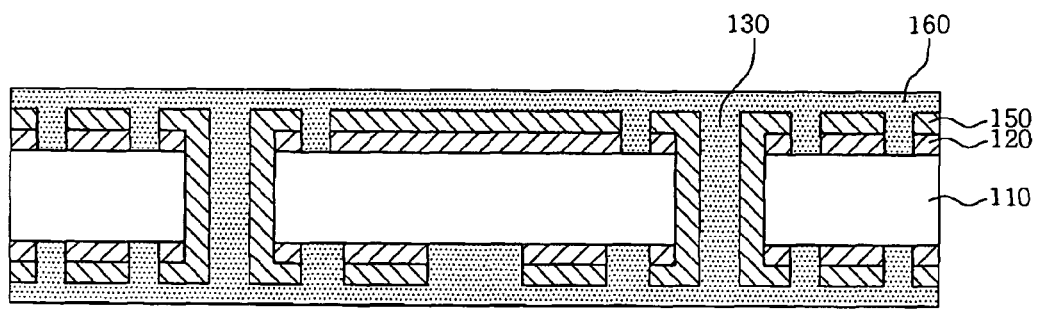

Subsequently, an outer circuit pattern 150, including a bonding pad, is formed with the plated layer 140, as shown in FIG. 8D.

In more detail, a UV-curable dry film (D/F) is coated over the plated layer 140 formed on the CCL 100 and then aligned with an artwork film having a predetermined circuit pattern. The dry film is exposed through the artwork film to UV light so that the dry film is cured at portions corresponding to the circuit pattern 150. A developing process removes uncured dry film portions to selectively expose the plated layer. Using an etchant, dry film-removed portions of the plated layer 140, that is, open portions of the plated layer 140, are etched, after which the dry film is peeled off to form a predetermined circuit pattern 150 for a bonding pad.

The next step is the formation of an insulation layer 160 with openings corresponding to bonding pads (S200).

In this connection, a blanket of an insulation layer 160 is deposited over the outer circuit pattern 150.

Figure 8F:
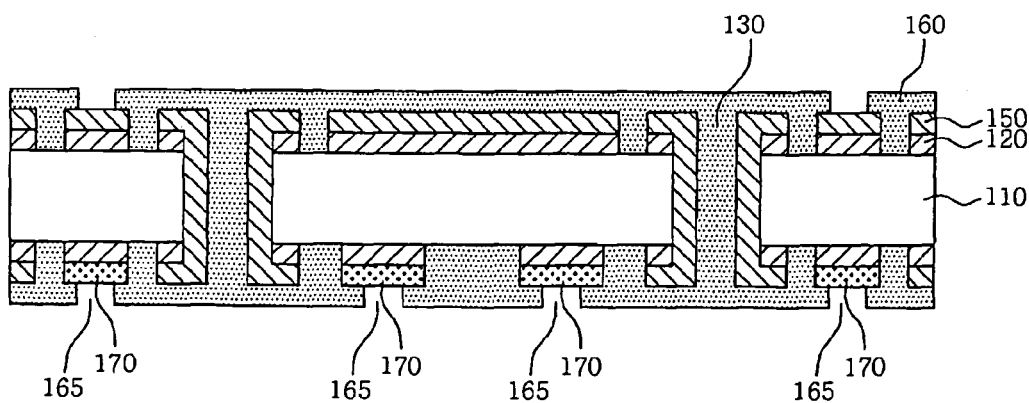

Openings 165 are provided in the insulation layer 160 so as to expose the bonding pads 170, as shown in FIG. 8F.

A heat-resistant resin which can endure the melting point of the solder balls, that is, PSR (photo imageable solder resist mast) ink, is suitable as a material for the insulation layer 160. The insulation layer 160 plays an important role in protecting the outer circuit patterns 150 as well as in preventing a solder bridge between the outer circuit patterns 150 upon a soldering process.

The formation of the openings 165 in the insulation layer 160 may be achieved by, for example, applying PSR ink 160 over the outer circuit pattern 150, curing the PSR ink 160 by UV light with the aid of a diazo film, having a predetermined circuit pattern thereon, so selectively that only the PSR ink 160, on bonding pads 170 to which solder balls 160 will be bonded, is unexposed to UV light, followed by etching the uncured PSR ink coated over the bonding pads 170.

A solder contact side is formed by etching each of the bonding pads at the open region thereof and partially at the region covered by the insulation layer 160 (S300).

In detail, an etching process, e.g., a wet etching process, is conducted on each bonding pad 170 so as to etch not only the open region, but also the region covered by the insulation layer 160, resulting in the formation of a solder contact side 175 that is larger in surface area than the opening.

The solder contact side has a dish configuration which is planar at the center and slanted at the periphery, so that an increase can be brought about in the bonding area between the bonding pad 170 and the solder ball and thus in the bonding strength therebetween.

Between the solder contact side 175 and the insulation layer 160, as shown in the inset of FIG. 8F, there is a bend A that consists of a planar upper face extending from an end 161 of the lower surface of the insulation layer 160 in an outward direction (← direction), and a lower face slanting away from one end of the planar upper face. With this configuration, the bend A functions to prevent the solder balls from becoming detached from the substrate, thereby increasing the resistance to external impact.

That is, having such a structure that the formation of a solder ball thereat allows the interfaces between the solder and the insulation layer 160 and between the solder ball and the bonding pad 170 to meet each other, the bend A can function to disperse the stress exerted on the solder ball and bring about good results in drop testing.

Figure 8G:
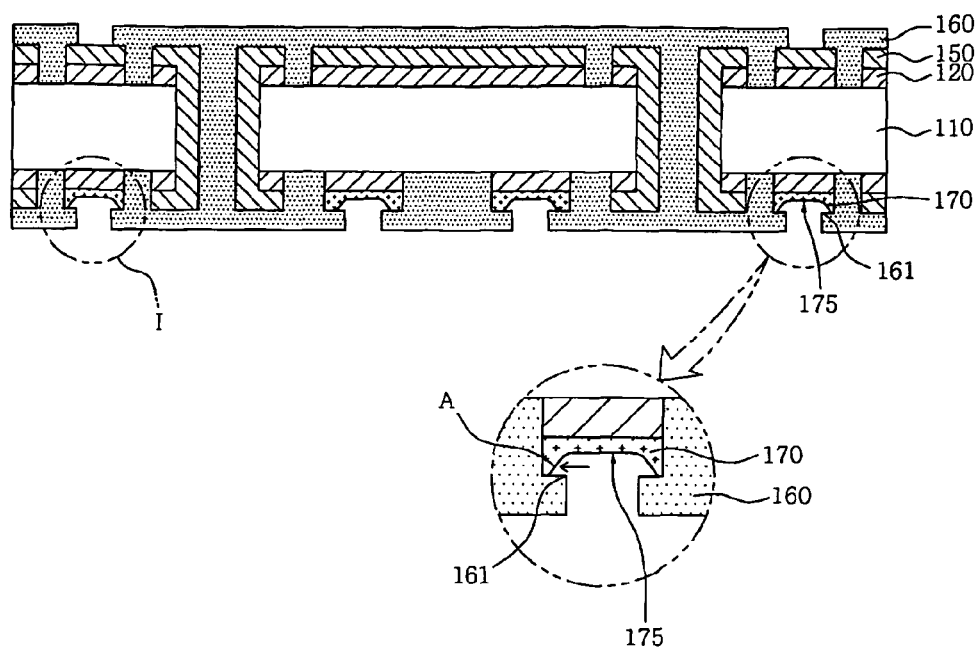
Figure 9:
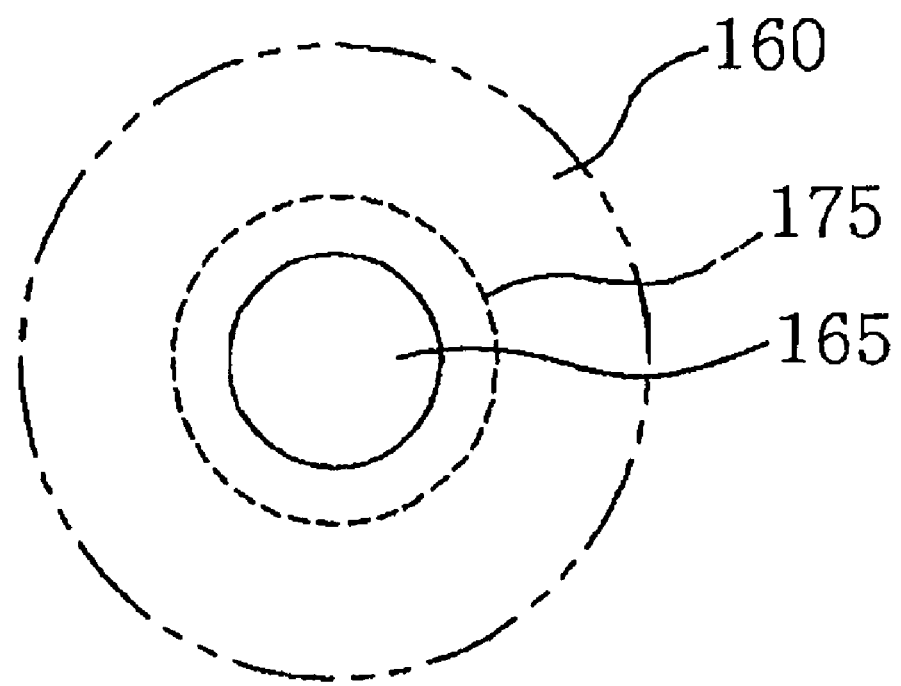
FIG. 9 is a plan view showing portion I of FIG. 8G on an enlarged scale.

Turning to FIG. 9, region 1 of FIG. 8G, provided in the plan view, shows the opening 165 of the insulation layer 160. As seen in this figure, the opening 165 is within the solder contact side 175. As described above, the solder contact side 175 is formed beyond the opening 165, although an etching process is conducted on the open region of the bonding pad 170. Preferably, the solder contact side 175 is concentric with the opening 165. At the opening 165, therefore, the insulation layer 160 is partially coated on the solder contact side 175, with such a gap away from the solder contact side 175 as to form the upper face of the bend A, as shown in FIG. 8G. The insulation layer 160, present between the solder contact side 175 and the opening 165 in FIG. 9, plays an important role in supporting the solder ball bonded to the bonding pad 170 and protecting the solder balls from external impact.

Afterwards, a surface-finished layer is formed on the upper surface of the solder contact side to afford a BGA package substrate (S400).

Figure 8H:
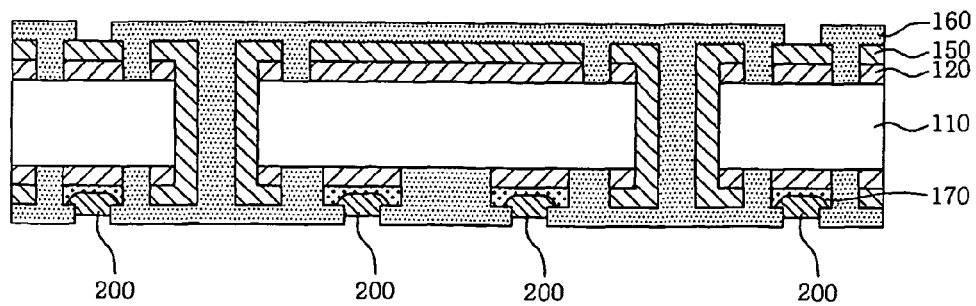

In this regard, as shown in FIG. 8H, a finishing process is conducted on the surface of the bonding pad 170 using an OSP (organic solderability preservative) 200.

In addition to oxidation prevention, the finishing process enhances the solderability and conductivity of parts to be mounted. According to various requirements, new techniques have been developed for the finishing process, as follows.

First, HASL (hot air solder leveling) is a finishing process in which, after a substrate is immersed in molten solder in a hot tank, high pressure air is provided so as to evenly solder a portion which is not coated with the insulation layer. With the ability to prevent the oxidation of exposed copper circuits and enhance solderability when parts are mounted, the HASL process is usually used where reliability and thermal resistance are required.

Electroless Ni/Au plating is conducted by plating nickel prior to gold so as to provide excellent bondability for gold. Gold plating, although usually used for terminals of the substrate, can be introduced as an environmentally friendly finished process which provides good thermal resistance.

Able to allow direct plating of Pd on copper foil, electroless palladium (Pd)-plating is used for both surface finishing and terminal plating.

Conducted by coating silver at a thickness of 0.07-0.1 μm on copper, electroless silver(Ag)-plating, quite recently developed, is excellent in thermal resistance and solderability.

An OSP (organic solderability preservative) process, also called a pre-flux process, is divided into an organic solvent type and a water soluble type. The organic solvent type involves forming a resin coat over the entire substrate by roll coating or spraying.

Although explained using an example of an OSP process, the present invention can employ any of these other finishing process.

Next, a semiconductor device 300 is mounted on a side of the BGA package substrate, followed by a molding process (S500).

In more detail, the BGA package substrate coated with the OSP 200 is dehumidified by pre-baking under predetermined conditions, e.g., at about 120° C. for about 2 hours.

Figure 8I:
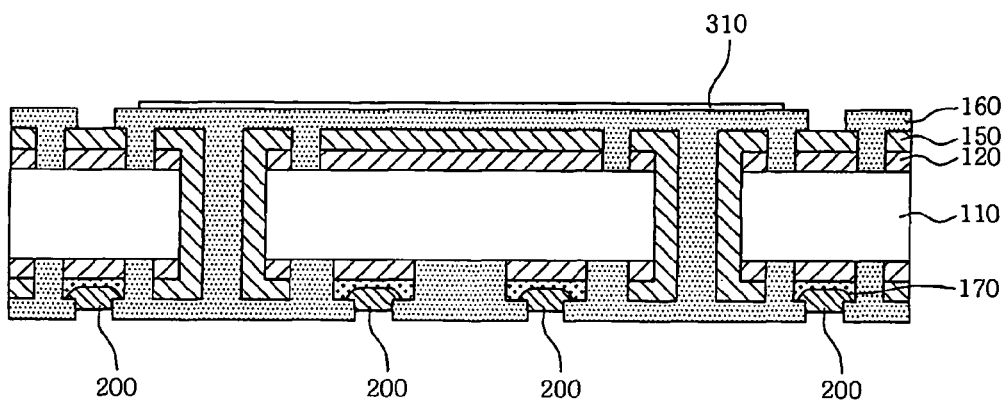
Figure 8J:
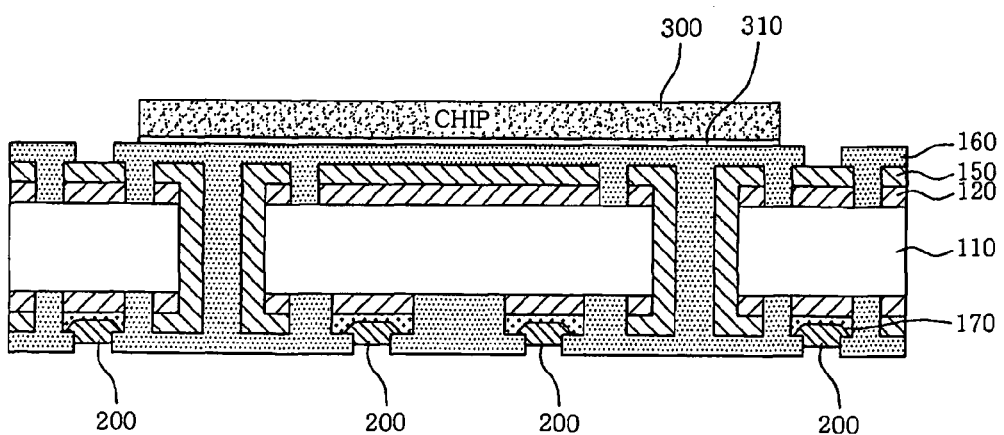

Subsequently, the semiconductor device is attached using an adhesive material 310, such as Ag epoxy or solder, bump onto a side of the BGA package substrate, followed by thermally curing the adhesive material 310 at about 150° C. for 30 min to fix the semiconductor device 300 onto the BGA package substrate, as shown in FIGS. 8I and 8J.

Figure 8K:
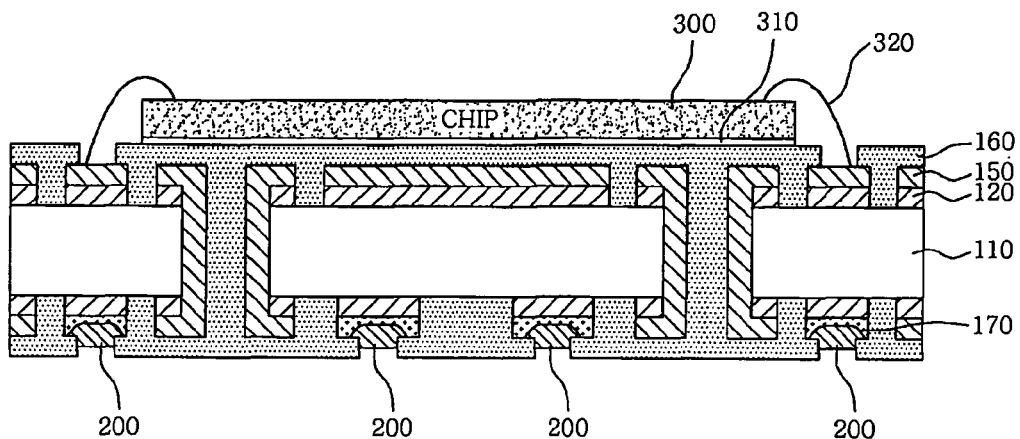

Afterwards, the semiconductor device 300 is bonded by a wire 320 to a wire bonding pad formed on a side of the BGA package substrate to allow transmission of electrical signals from the semiconductor device 300 to the outside, as shown in FIG. 8K.

Figure 8L:
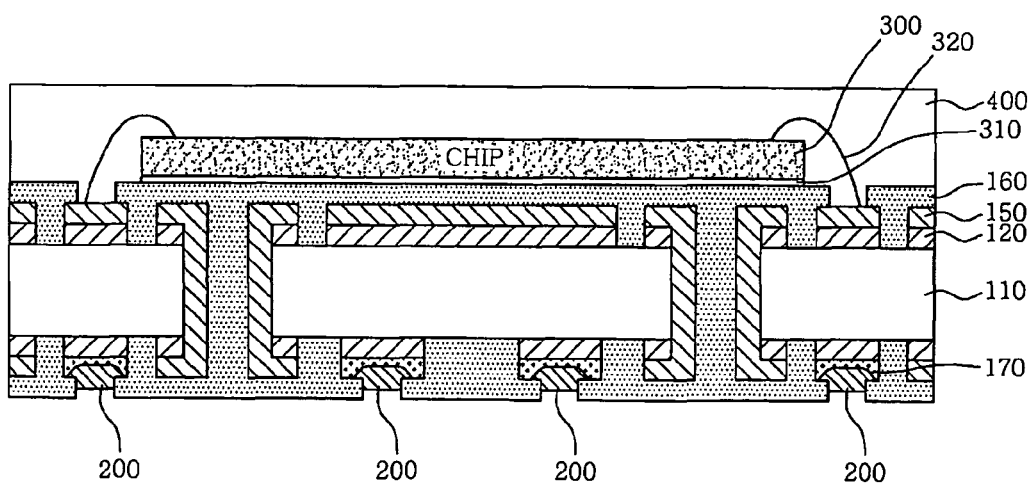

Next, an EMC molding process is conducted, in which the semiconductor device-mounting side of the BGA package substrate is covered with a liquid sealing member 400, e.g., a liquid epoxy resin, to protect the semiconductor device 300 from the external environment, as shown in FIG. 8L.

Figure 8M:
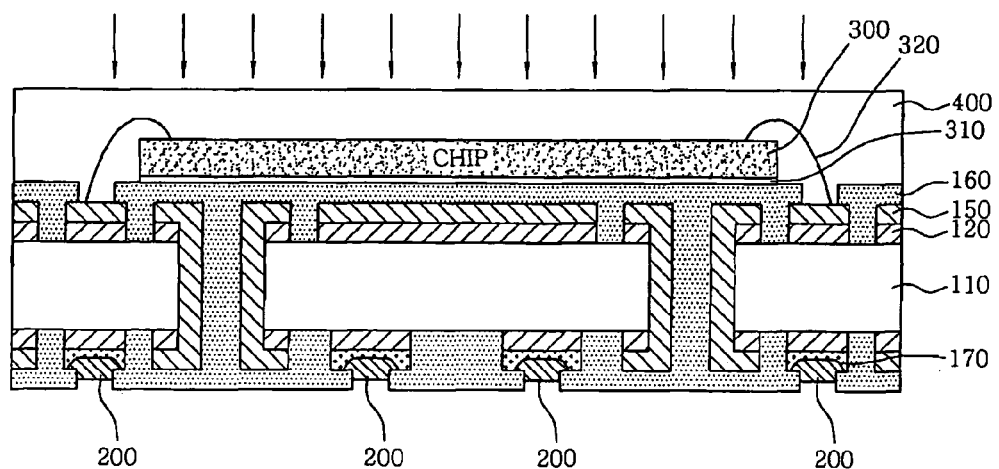

Thereafter, the BGA package substrate covered with the sealing member 400 is subjected to a PMC (post mold curing) process under predetermined conditions, for example, at 175-215° C. for 5-7 hours, to cure the sealing member 400, as shown in FIG. 8M.

The next step is to form a solder ball in the bend A and in and over the opening while it is in contact with the solder contact side (S600).

Figure 8N:
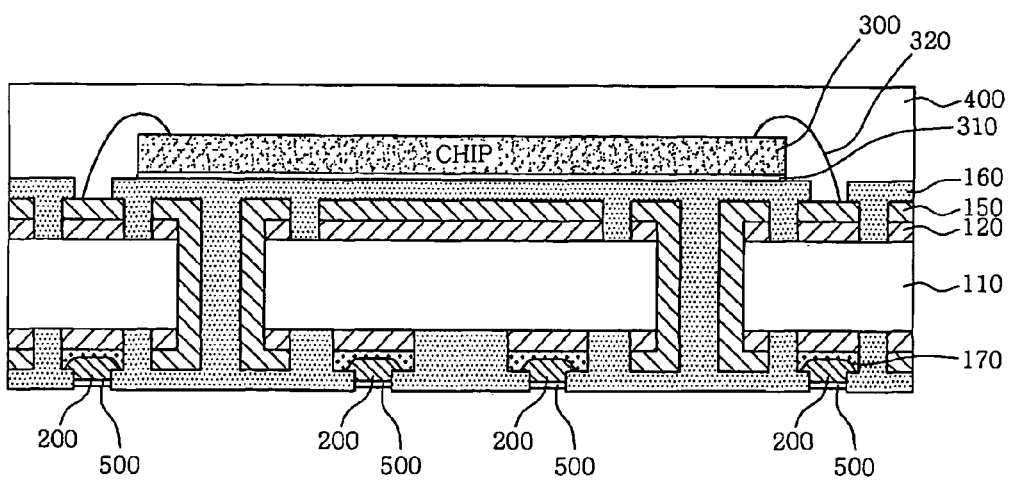

To this end, first, a viscous post-flex 500 is layered over the bonding pad 170, as shown in FIG. 8N.

Containing an alcohol-based component and an acidic component, the post-flex 500 dissolves the OSP 200 based on imidazole, so that the OSP 200 remaining in the bonding pad 170 and thermally damaged by the PMC process, can be removed.

Figure 8O:
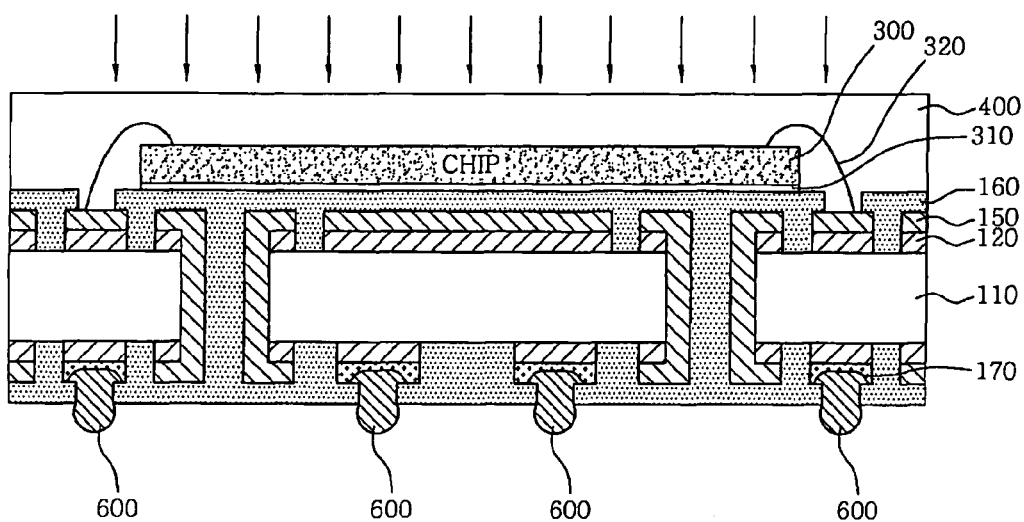
Figure 8P:
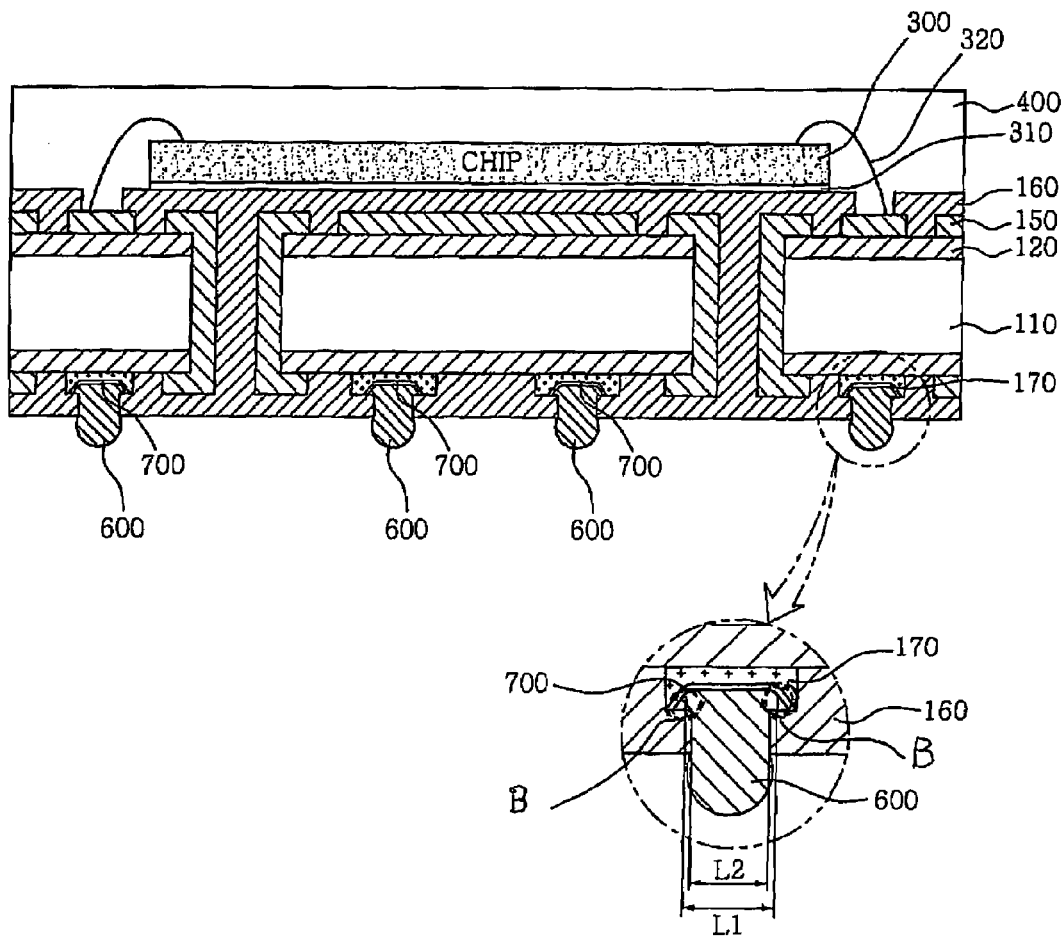

The BGA package substrate is subjected to IR reflow at about 230-260° C. for 30 sec, as shown in FIG. 8O, to afford an intermetallic compound 700, by which a solder ball 600 is firmly bonded to the bend A of the solder pad 170, as shown in FIG. 8P.

In the method of manufacturing a BGA package according to the present invention, the solder ball 600 attached to the etched portion of the bonding pad, as shown in the dotted circle of FIG. 8P, is formed in such a way that the upper part (L1) thereof, in contact with the solder contact side is larger in cross sectional area than the lower part (L2) thereof, in contact with the opening. Accordingly, an increase can be brought about in the bonding area between the bonding pad 170 and the solder ball and thus in the bonding strength therebetween, enabling the solder ball to be imparted with excellent drop test properties, e.g., to seldom be detached from the bonding pad 170 by external impact.

Figure 10:
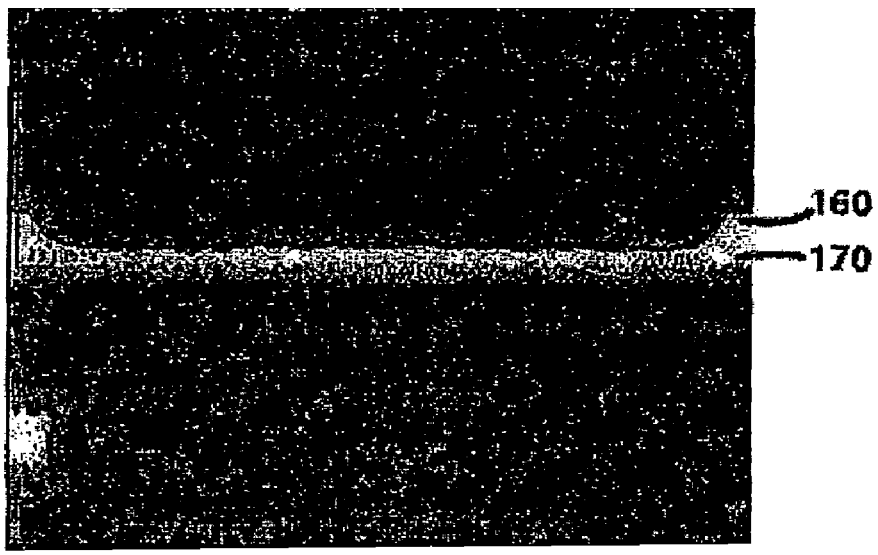
FIG. 10 is a view showing a cross section of a finished bonding pad having a concave configuration, which is subjected to a finishing process according to the present invention.
Figure 11:
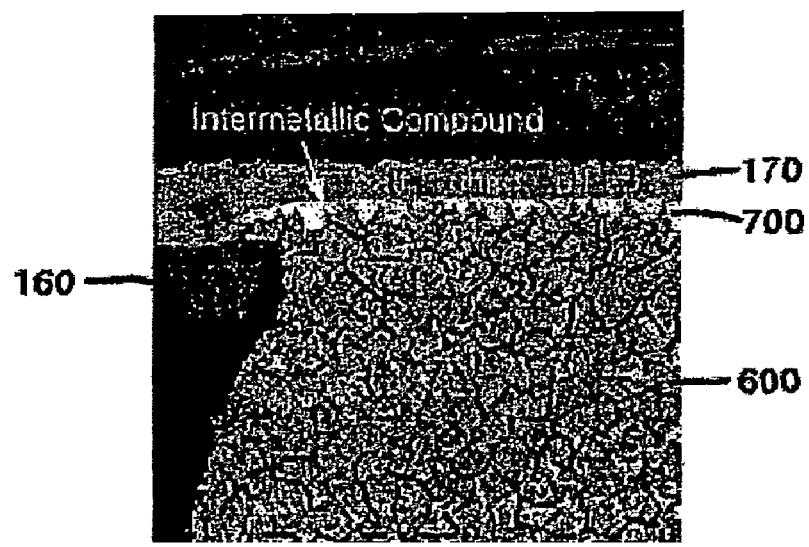
FIG. 11 is an enlarged view showing an intermetallic compound formed between the surface-finished, concave bonding pad and the solder ball.

Thanks to the fact that, as demonstrated in FIGS. 10 and 11, the intermetallic compounds 700 resulting from the reaction between the copper of the bonding pad 170 and the tin of the solder ball 600 are formed not only over the bonding pad 170 corresponding to the opening, but also over the solder contact side 175 covered by the insulation layer 160, the solder ball 600 is more perfectly bonded to the bonding pad 170. As a result, the present invention enjoys the advantages of achieving a normal destruction mode in which a solder break occurs, dispersing the stress exerted to the solder ball 600, and improving the resistance to external impact thanks to the bend A which supports the solder ball 600 on the insulation layer 160.

Figure 12:
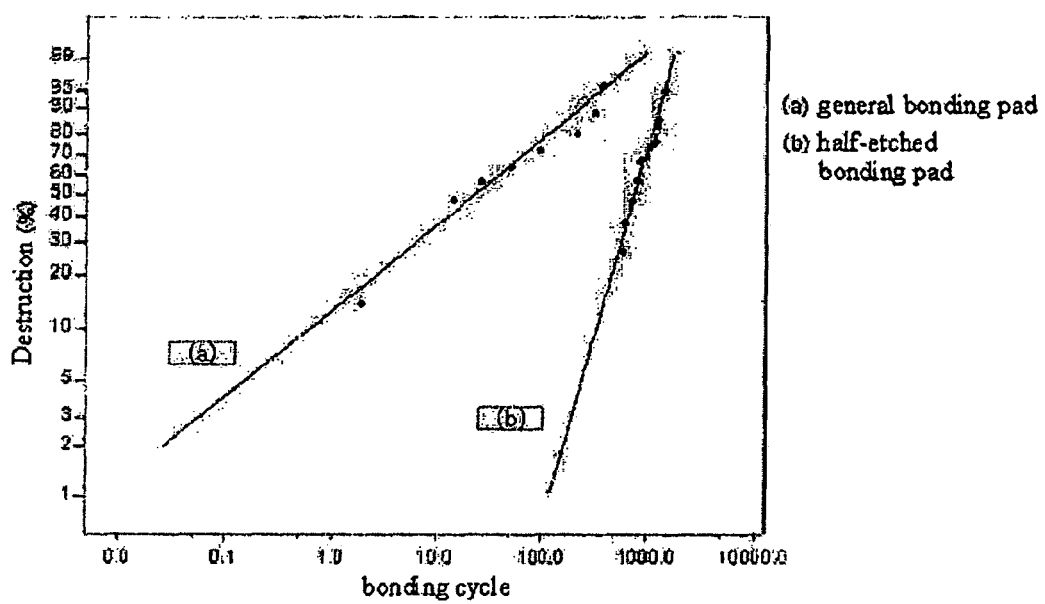
FIG. 12 is a graph in which destruction percentages of finishing-treated bonding pads having a concave shape are plotted versus bonding cycles.

The method according to the present invention, as shown in FIG. 12, can manufacture a BGA package, showing a greatly decreased destruction rate versus the bonding cycle of the bonding pad as compared to conventional methods.

In the BGA package and its manufacturing method according to the present invention, as described above, the open region of the bonding pad is etched to a depth below the insulation layer to provide an etched portion which is planar at the bottom center and slanted at the periphery. With this structure of the etched portion, the bonding pad provides an increased bonding area for the solder, so that the BGA package substrate is enhanced in reliability, showing excellent interfacial properties and drop test results.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A BGA package substrate, comprising:
   an outer circuit pattern including a bonding pad on which a solder contact side is formed, the solder contact side being dish-shaped; and
   an insulation layer, formed over the outer circuit pattern, having therein at least one opening through which the solder contact side is partially exposed, with a portion of the insulation layer extending away from an edge of the opening for a predetermined distance in an outward direction, where an interior surface of the portion of the insulation layer meets an edge of the dish-shaped solder contact side, thereby forming an expanded bonding area on the dish-shaped solder contact side between the dish-shaped solder contact side and the interior surface of the portion of the insulation layer.

2. The BGA package substrate as set forth in claim 1, wherein the solder contact side is larger in cross sectional area than the opening.

3. The BGA package substrate as set forth in claim 1, wherein the dish-shaped solder contact side of the bonding pad is planar at a bottom center of the solder contact side and slanted at a peripheral edge of the solder contact side.

4. The BGA package substrate as set forth in claim 3, wherein the slanted portion of the dish-shaped solder contact side and the interior surface of the insulation layer form a bend.

5. The BGA package substrate as set forth in claim 4, further comprising a solder ball, the solder ball including a base portion formed to extend along the bend formed by the solder contact side and the interior surface of the insulation layer.

6. The BGA package substrate as set forth in claim 5, wherein the base portion of the solder ball is partly engaged with the interior surface of the insulation layer located on the bend and fixed upon the solder contact side.

7. The BGA package substrate as set forth in claim 1, further comprising a surface-finished layer, formed on the solder contact side, for protecting the bonding pad.

8. The BGA package substrate as set forth in claim 1, wherein the solder contact side is formed by conducting an etching process on the bonding pad.

9. A BGA package substrate, comprising:
an outer circuit pattern including a bonding pad, on which a solder contact side is formed; the solder contact side being circularly dish-shaped and
an insulation layer, formed over the outer circuit pattern, having therein at least one circular opening which is within an area defined by the solder contact side, with a portion of the insulation layer extending away from an edge of a the opening for a predetermined distance in an outward direction, where an interior surface of the portion of the insulation layer meets an edge of the dish-shaped solder contact side, thereby forming an expanded bonding area on the dish-shaped solder contact side between the dish-shaped solder contact side and the interior surface of the portion of the insulation layer.

10. The BGA package substrate as set forth in claim 9, wherein the solder contact side is concentrically aligned with the opening.

11. The BGA package substrate as set forth in claim 9, wherein the dish-shaped solder contact side of the bonding pad is planar at a bottom center of the solder contact side and slanted at a peripheral edge of the solder contact side.

12. The BGA package substrate as set forth in claim 11, wherein the slanted portion of the dish-shaped solder contact side and the interior surface of the insulation layer form a bend.

13. The BGA package substrate as set forth in claim 12, further comprising a solder ball, the solder ball including a base portion formed to extend along the bend formed by the solder contact side and the interior of the insulation layer.

14. The BGA package substrate as set forth in claim 13, wherein the base portion of the solder ball is partly engaged with the interior surface of the insulation layer located on the bend and fixed upon the solder contact side.

15. The BGA package substrate as set forth in claim 9, further comprising a surface-finished layer, formed on the solder contact side, for protecting the bonding pad.

16. The BGA package substrate as set forth in claim 9, wherein the solder contact side is formed by conducting an etching process on the bonding pad.

17. A BGA package substrate, comprising:
an outer circuit pattern including a bonding pad on which a solder contact side is formed, the solder contact side being dish-shaped;
an insulation layer, formed over the outer circuit pattern, having therein at least one opening through which the solder contact side is partially exposed, with a portion of the insulation layer extending away from an edge of the opening for a predetermined distance in an outward direction, wherein a slanted portion at a peripheral edge of the dish-shaped solder contact side and an interior surface of the portion of the insulation layer form a bend;
a solder ball formed in the bend and in and over the opening while being in contact with the solder contact side; and
a semiconductor chip mounted on an exterior side of the insulation layer.

18. The BGA package substrate as set forth in claim 17, wherein the solder contact side is larger in cross sectional area than the opening.

19. The BGA package substrate as set forth in claim 17, wherein the dish-shaped solder contact side of the bonding pad is planar at a bottom center and slanted at a periphery.

20. The BGA package substrate as set forth in claim 17, wherein a base portion of the solder ball is partly engaged with the interior surface of the insulation layer located on the bend and fixed upon the solder contact side.

21. The BGA package substrate as set forth in claim 17, further comprising a surface-finished layer, formed on the solder contact side, for protecting the bonding pad.

22. The BGA package substrate as set forth in claim 17, wherein the solder contact side is formed by conducting an etching process on the bonding pad.

* * * * *